US012575448B2

(12) United States Patent
Goh et al.

(10) Patent No.: US 12,575,448 B2
(45) Date of Patent: Mar. 10, 2026

(54) INTEGRATED CIRCUIT PACKAGES WITH ON PACKAGE MEMORY ARCHITECTURES

(71) Applicant: Intel Corporation, Santa Clara, CA (US)

(72) Inventors: Eng Huat Goh, Ayer Itam (MY); Mooi Ling Chang, Bayan Baru (MY); Poh Boon Khoo, Perai (MY); Chu Aun Lim, Hillsboro, OR (US); Min Suet Lim, Gelugor (MY); Prabhat Ranjan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 856 days.

(21) Appl. No.: 17/483,670

(22) Filed: Sep. 23, 2021

(65) Prior Publication Data

US 2023/0091395 A1 Mar. 23, 2023

(51) Int. Cl.
| | |
|---|---|
| *H01L 25/065* | (2023.01) |
| *H01L 21/48* | (2006.01) |
| *H01L 23/00* | (2006.01) |
| *H01L 23/367* | (2006.01) |
| *H01L 23/498* | (2006.01) |
| *H01L 25/00* | (2006.01) |
| *H01L 25/18* | (2023.01) |

(52) U.S. Cl.
CPC ...... *H01L 25/0655* (2013.01); *H01L 21/4853* (2013.01); *H01L 23/3672* (2013.01); *H01L 23/49838* (2013.01); *H01L 24/16* (2013.01); *H01L 25/18* (2013.01); *H01L 25/50* (2013.01); *H01L 2224/16227* (2013.01); *H01L 2924/1436* (2013.01)

(58) Field of Classification Search
CPC ............. H01L 25/0655; H01L 21/4853; H01L 23/3672; H10B 12/00
See application file for complete search history.

(56) References Cited

U.S. PATENT DOCUMENTS

| | | | | |
|---|---|---|---|---|
| 2013/0309813 A1* | 11/2013 | Shih | ..................... | H01L 25/0657 |
| | | | | 438/118 |
| 2015/0311186 A1* | 10/2015 | Ye | ........................... | H01L 24/49 |
| | | | | 438/109 |
| 2016/0240463 A1* | 8/2016 | Jow | .................... | H01L 23/49805 |
| 2019/0245543 A1* | 8/2019 | Lee | ........................ | G11C 11/419 |

(Continued)

FOREIGN PATENT DOCUMENTS

WO WO-2024117976 A1 * 6/2024

*Primary Examiner* — Ratisha Mehta
*Assistant Examiner* — Timothy Edward Duren
(74) *Attorney, Agent, or Firm* — Hanley, Flight & Zimmerman, LLC

(57) ABSTRACT

Integrated circuit (IC) packages with On Package Memory (OPM) architectures are disclosed herein. An example IC package includes a substrate having a first side and a second side opposite the first side, a semiconductor die mounted on the first side of the substrate, and a die pad on the first side of the substrate. The die is electrically coupled to the die pad. The IC package also includes a memory pad on the first side of the substrate. The memory pad is to be electrically coupled to a memory mounted on the first side of the substrate. The IC package further includes a ball on the second side of the substrate, and a memory interconnect in the substrate electrically coupling the die pad, the memory pad, and the ball.

20 Claims, 5 Drawing Sheets

(56)  References Cited

U.S. PATENT DOCUMENTS

| | | | |
|---|---|---|---|
| 2019/0393121 A1* | 12/2019 | Swaminathan | ......... H01L 24/17 |
| 2023/0009553 A1* | 1/2023 | Yu | ....................... H01L 25/0657 |
| 2023/0309813 A1* | 10/2023 | Richards | ................ A61B 46/20 |
| | | | 600/201 |
| 2023/0317689 A1* | 10/2023 | Pang | .................... H01L 25/105 |
| | | | 257/777 |

* cited by examiner

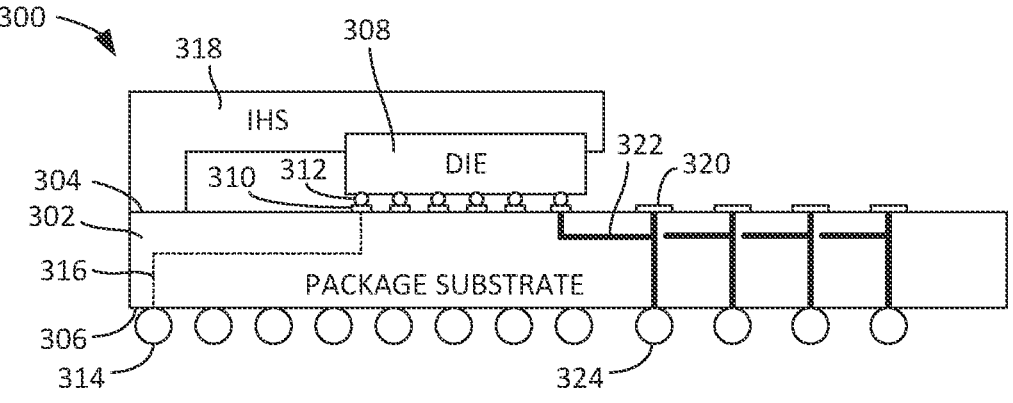
FIG. 3
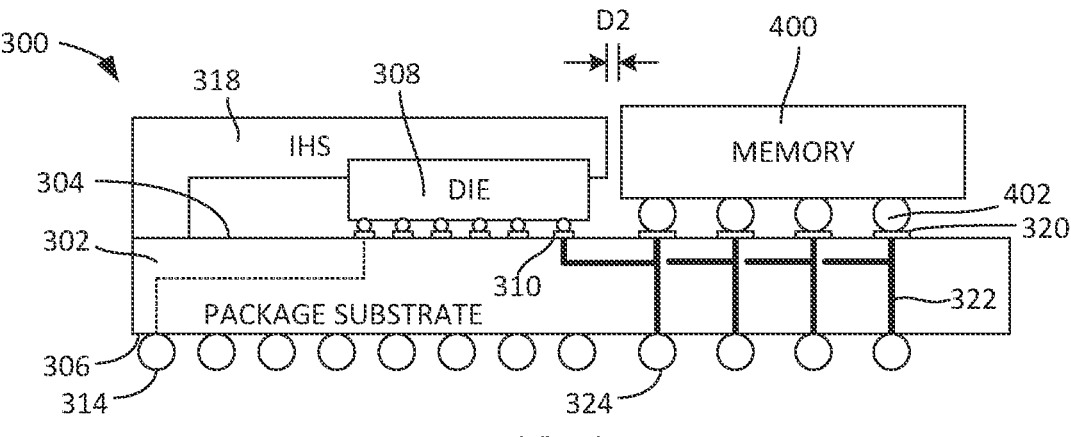
FIG. 4
FIG. 5

TOP LAYER
BOTTOM LAYER
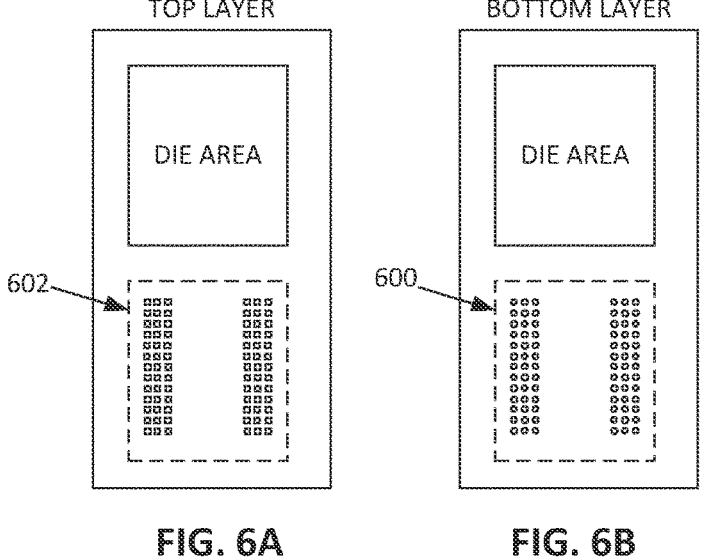
DIE AREA
DIE AREA
602
600
FIG. 6A
FIG. 6B
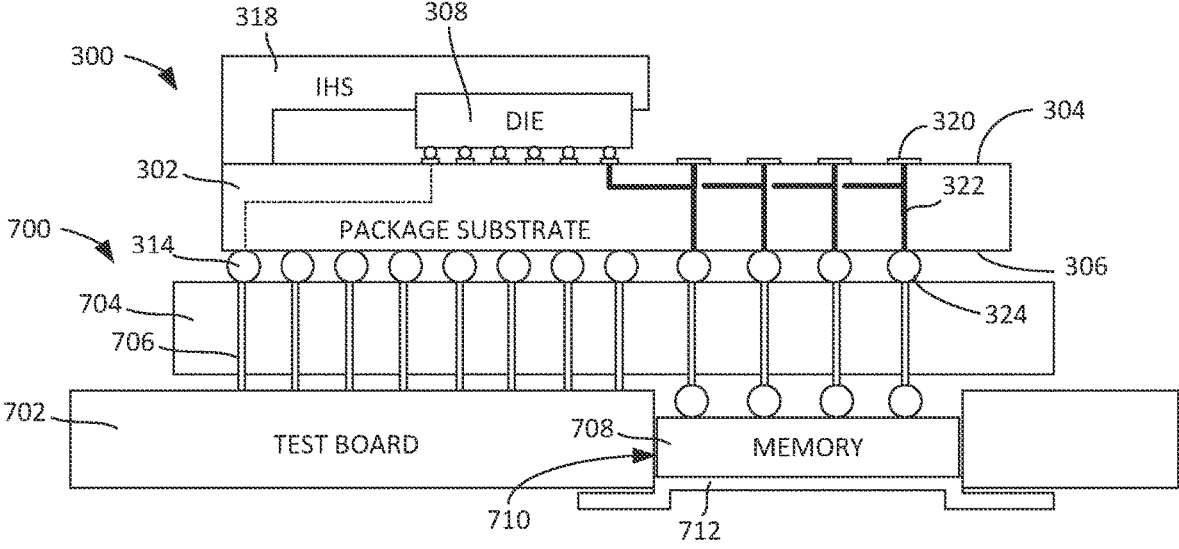
318
308
300
IHS
DIE
320
304
302
322
700
314
PACKAGE SUBSTRATE
306
704
324
706
702
TEST BOARD
708
MEMORY
710
712
FIG. 7

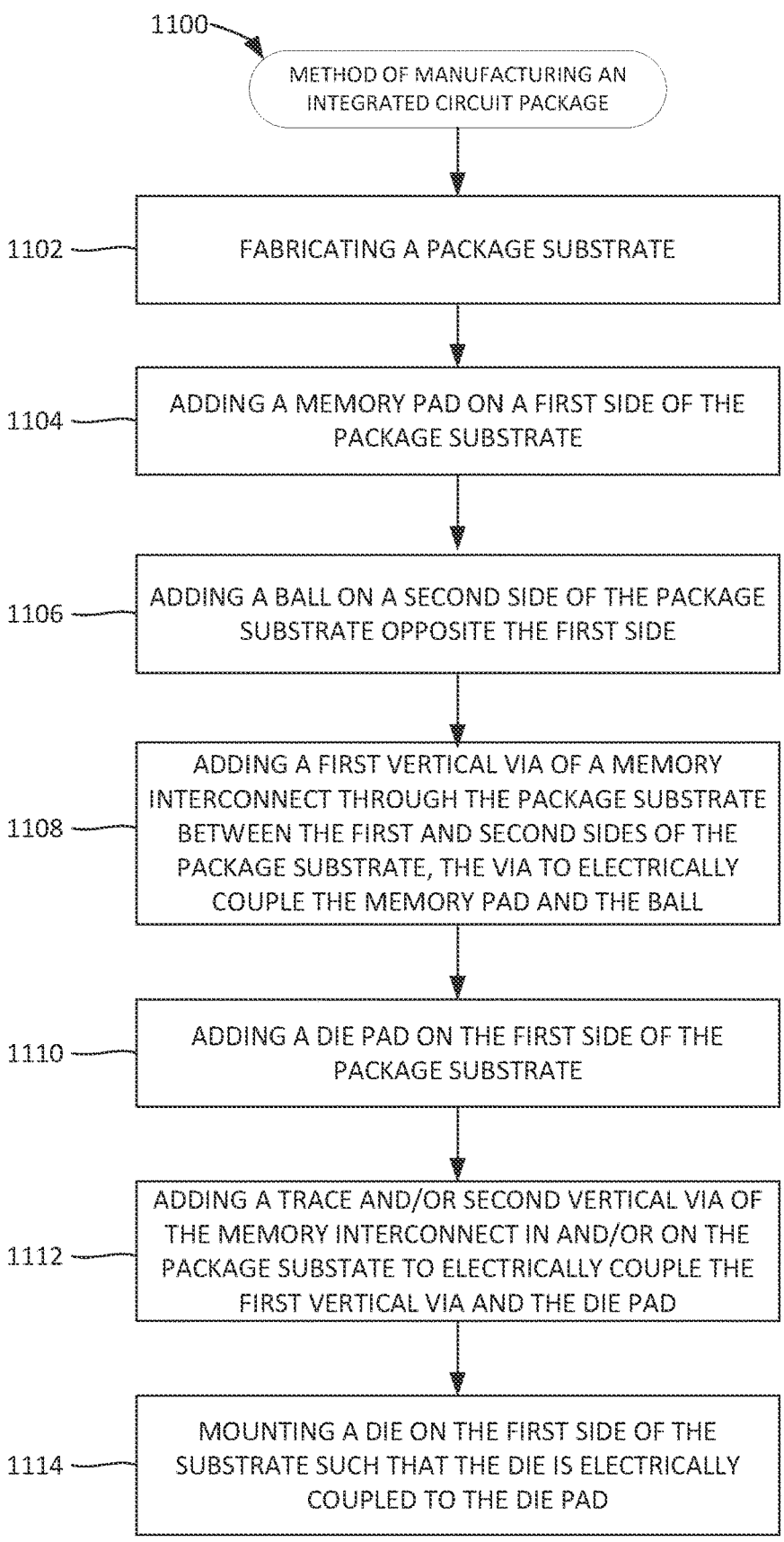

1100

METHOD OF MANUFACTURING AN INTEGRATED CIRCUIT PACKAGE

1102 — FABRICATING A PACKAGE SUBSTRATE

1104 — ADDING A MEMORY PAD ON A FIRST SIDE OF THE PACKAGE SUBSTRATE

1106 — ADDING A BALL ON A SECOND SIDE OF THE PACKAGE SUBSTRATE OPPOSITE THE FIRST SIDE

1108 — ADDING A FIRST VERTICAL VIA OF A MEMORY INTERCONNECT THROUGH THE PACKAGE SUBSTRATE BETWEEN THE FIRST AND SECOND SIDES OF THE PACKAGE SUBSTRATE, THE VIA TO ELECTRICALLY COUPLE THE MEMORY PAD AND THE BALL

1110 — ADDING A DIE PAD ON THE FIRST SIDE OF THE PACKAGE SUBSTRATE

1112 — ADDING A TRACE AND/OR SECOND VERTICAL VIA OF THE MEMORY INTERCONNECT IN AND/OR ON THE PACKAGE SUBSTATE TO ELECTRICALLY COUPLE THE FIRST VERTICAL VIA AND THE DIE PAD

1114 — MOUNTING A DIE ON THE FIRST SIDE OF THE SUBSTRATE SUCH THAT THE DIE IS ELECTRICALLY COUPLED TO THE DIE PAD

FIG. 11

INTEGRATED CIRCUIT PACKAGES WITH ON PACKAGE MEMORY ARCHITECTURES

FIELD OF THE DISCLOSURE

This disclosure relates generally to integrated circuits and, more particularly, to integrated circuit packages with on package memory architectures.

BACKGROUND

In many integrated circuit packages, one or more semiconductor dies are mechanically and electrically coupled to an underlying package substrate. Some integrated circuit packages also include one or more memories on the package substrate, commonly referred to as an On Package Memory (OPM) architecture. Package manufacturers test the contacts and other circuitry on the package via a testing interface unit prior to selling the package.

BRIEF DESCRIPTION OF THE DRAWINGS

FIG. 3 illustrates an example integrated circuit (IC) package constructed in accordance with teachings of this disclosure.

FIG. 4 illustrates the example IC package of FIG. 3 with an example memory.

FIG. 5 is an enlarged view of a portion of the example IC package of FIG. 4 showing two example memory interconnects.

FIGS. 6A and 6B show example pinout or ballmap patterns on top and bottom layers, respectively, of an example package substrate of the example IC package of FIG. 3.

FIG. 7 illustrates an example testing interface unit (TIU) that can be used to test the example IC package of FIG. 3.

FIG. 11 is a flowchart illustrating an example method of manufacturing an integrated circuit package in accordance with teachings disclosed herein.

Figure 1:
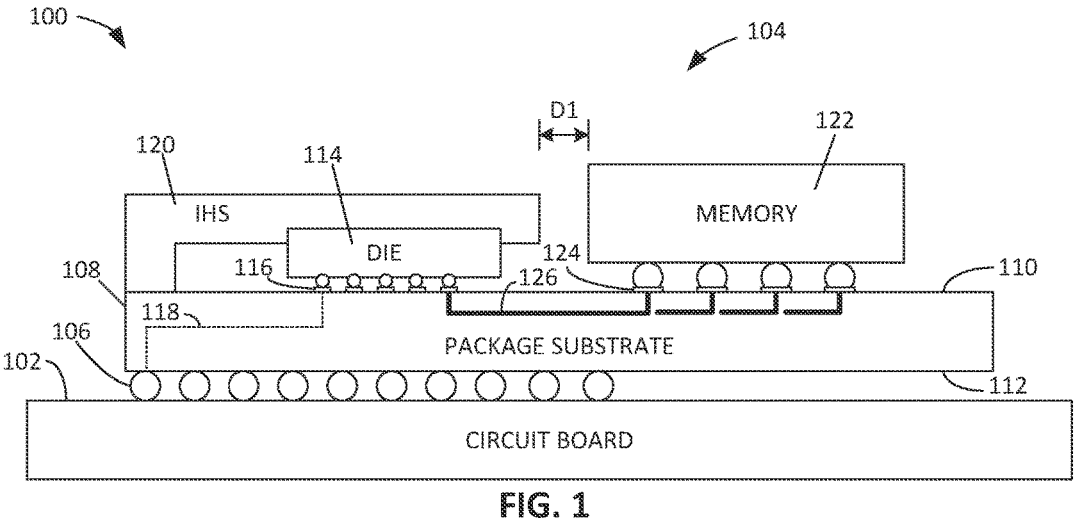
FIG. 1 illustrates a known assembly including a circuit board and an integrated circuit (IC) package with a memory.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part.

Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

Example integrated circuit (IC) packages and methods of making the same are disclosed herein. Example IC packages disclosed herein include a package substrate and memory interconnects in the package substrate that electrically couple memory pads on a first side (a top side) of the package substrate and balls on a second side (a bottom side) of the package substrate opposite the first side. Therefore, the pinout or ballmap pattern is duplicated on the second side (the bottom side) of the package substrate. The memory pads on the first side enable a memory to be electrically coupled to the top side of the package substrate. The balls on the second side enable a testing interface unit to be socketed to the memory interconnects from the second side (the bottom side) of the package substrate so that a memory does not need to be socketed to the memory pads on the first side (the top side) of the package substrate during testing. This reduces many challenges during testing and enables the location of the memory to be disposed closer to the other components on the package substrate, thereby reducing the overall size and footprint of the package.

Before disclosing the details of the example IC packages and methods, a brief description of known IC package architectures is provided. FIG. 1 is a side or cross-sectional view of a known assembly 100 that includes a circuit board 102 (sometimes referred to as a motherboard) and an integrated circuit (IC) package 104 that is electrically and mechanically coupled to the circuit board 102. The package 104 is electrically coupled to the circuit board 102 via a plurality of balls 106 (e.g., a ball grid array) (one of which is referenced in FIG. 1). The package 100 includes a package substrate 108 having a first side 110 (a top side) and a second side 112 (a bottom side) opposite the first side 110. The package 100 includes a semiconductor (e.g., silicon) die 114 mounted on the first side 110 of the package substrate 108. The package 100 has die pads 116 (one of which is referenced in FIG. 1) on the first side 110. The die 114 is electrically coupled (e.g., soldered) to the die pads 116. The package 100 includes interconnects 118 (one of which is referenced in FIG. 1) in the package substrate 108 that electrically couple certain ones of the die pads 116 and certain ones of the balls 106. In FIG. 1, the package 104 includes an integrated heat spreader (IHS) 120 that at least partially encloses or covers the die 114. The IHS 120 helps dissipate heat from the die 114.

The package 104 includes a memory 122 mounted on the package substrate 108 and, in particular, on the first side 110 of the package substrate 108. This type of architecture is referred to as an On Package Memory (OPM) architecture. OPM architectures are advantageous over architectures having the memory on the circuit board 102 because they free up space on the circuit board 102 that can be used by other components. OPM architectures also result in better memory power and memory performance due to shorter trace lengths on the package. In FIG. 1, the package 104 has memory pads 124 (one of which is referenced in FIG. 1) on the first side 110 of the package substrate 108. The memory 122 is electrically coupled (e.g., soldered) to the memory pads 124. The package 104 has memory interconnects 126 (one of which is referenced in FIG. 1) that electrically couple certain ones of the memory pads 124 and certain ones of the die pads 116. As such, the memory 122 is electrically coupled (via the memory interconnects 126) to the die 114.

As shown in FIG. 1, the memory 122 is spaced from the IHS 120 by a distance D1. It is often desired to reduce the distance D1 to achieve a more compact arrangement of components. However, because of complex and difficult testing procedures, the memory 122 is often spaced farther from the IHS 120. In particular, many package manufacturers produce and sell packages without the memory. This allows customers or end users to attach their own memories as desired. Prior to selling a package, the package manufacturer tests the package according to a Product and Process Validation (PPV) testing procedure. Because the package substrate 108 has contacts on the first and second sides 110, 112 (the top and bottom sides), this requires a complex top and bottom side probing during testing.

Figure 2:
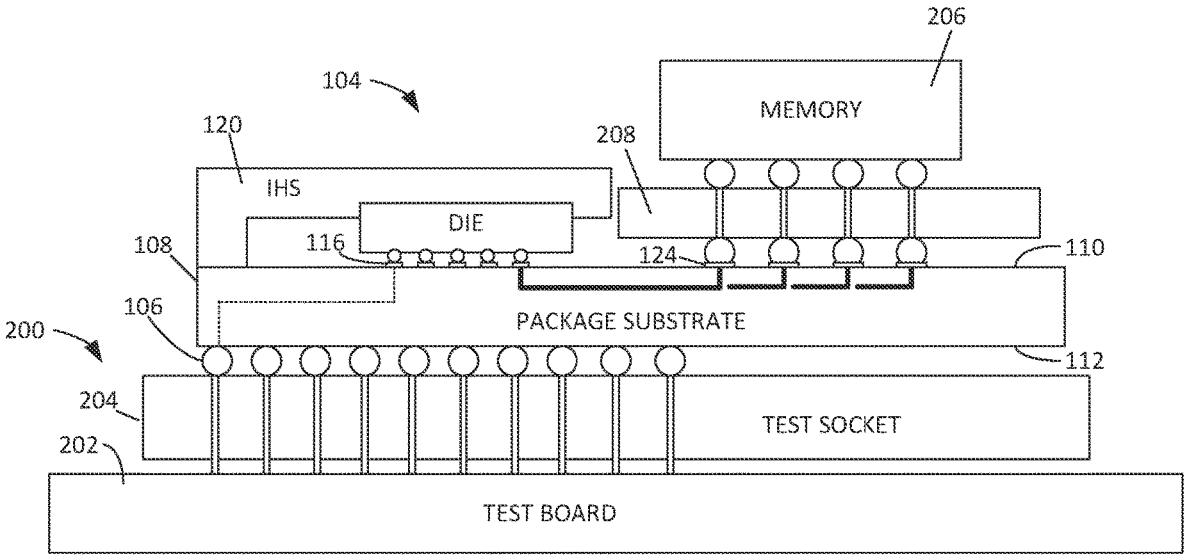
FIG. 2 illustrates a known testing interface unit (TIU) used for testing the IC package of FIG. 1.

For example, FIG. 2 shows a standard test interface unit (TIU) 200 that is used to test the package 104. The TIU 200 includes a test board 202. The TIU 200 also includes a package socket 204 that is used to electrically couple the balls 106 (one of which is referenced in FIG. 2) on the second side 112 of the package substrate 108 to the test board 202. Further, the TIU 200 requires a memory 206 and a memory socket 208 to temporarily electrically couple the memory 206 to the memory pads 124 on the first side 110 of the package substrate 108 during testing. As shown in FIG. 2, the memory socket 208 is relatively wide, which requires extra space between the memory pads 124 and the IHS 120. Therefore, the package 104 is designed with the location of the memory pads 124 spaced from the IHS 120 to accommodate this memory socket 208 during testing. Other known testing devices utilize an interposer on the first side 110 of the package substrate 108. The interposer extends beyond an edge of the package substrate and routes the signals from the memory pads 124 over to the edge of the package substrate 108, so that the package socket 204 can route the signals down to the test board 202. However, this results in a relatively long signal line (compared to the memory interconnects 126 (FIG. 1)), which can negatively impact high speed testing procedures. Therefore, some package manufacturers install a memory on the package substrate 108 when manufacturing the package 104 (rather than having to test the package without a memory before selling the package). However, this requires the package manufacturer to have the memories on hand (e.g., by buying the memories from a third party and/or fabricating the memories, etc.), which is often expensive, and which is not preferred by customers who desire to customize the package 104 with their own memory.

Disclosed herein are example IC packages and methods of making IC packages that address the above drawbacks. FIG. 3 is a side or cross-sectional view of an example IC package 300 constructed in accordance with teachings of this disclosure. The example package 300 has a OPM architecture with matching top and bottom side contacts (e.g., pads, balls, pins, etc.) for a memory, which can be used for socketing a memory to a bottom side of the package 300 during PPV testing, as disclosed in further detail herein.

In the illustrated example, the package 300 includes a package substrate 302 having a first side 304 (a top side) and a second side 306 (a bottom side) opposite the first side 304. In some examples, the package substrate 302 is constructed of an organic dielectric material (e.g., epoxy resin). In other examples, the package substrate 302 can be constructed of other materials (e.g., silicon). In some examples, the package substrate 302 is constructed by building (e.g., depositing) one or more layers of substrate material.

In the illustrated example, the package 300 includes an example semiconductor (e.g., silicon) die 308 mounted to the package substrate 302. In the illustrated example, the die 308 is mounted on the first side 304 of the package substrate 302. The die 308 is electrically and mechanically coupled to the package substrate 302. While only one die is shown, the package 300 can include any number of dies (e.g., two, three, four, etc.). In the illustrated example, the package 300 has a plurality of die pads 310 (one of which is referenced in FIG. 3) on the first side 304 of the package substrate 302. The package 300 can include any number of die pads 310. In this example, the die pads 310 extend outward from the first side 304. However, in other examples, the dies pads 310 can be flush or recessed relative to the first side 304. The die 308 has a plurality of bumps or balls 312 on its bottom side. The balls 312 are engaged with the die pads 310 on the first side 304, which electrically couples the die 308 to the die pads 310 and, thus, to the package substrate 302. In some examples the balls 312 and the die pads 310 are fused or soldered (e.g., by processing in a reflow oven), which electrically and mechanically couples the die 308 to the package substrate 302.

Figure 8:
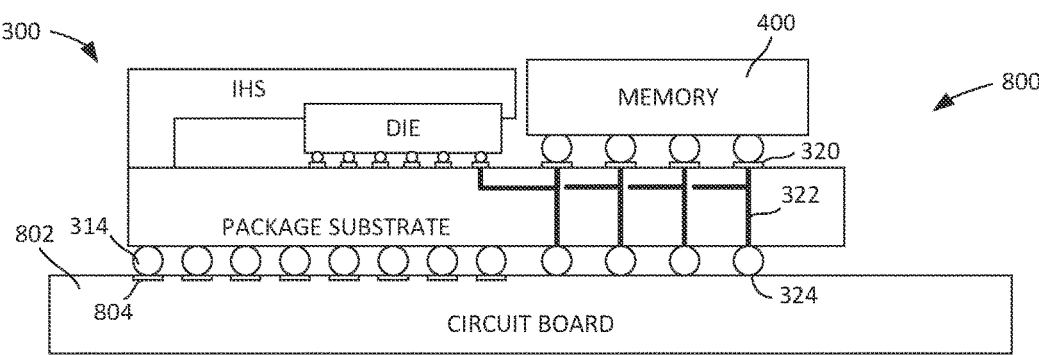
FIG. 8 illustrates an example assembly including an example circuit board and the example IC package of FIG. 3 on the example circuit board.

In the illustrated example, the package 300 includes a first plurality of balls 314 (one of which is referenced in FIG. 3)

on the second side 306 of the package substrate 302. The package 300 can include any number of balls 314. The balls 314 can be used to electrically couple the package 300 to a circuit board, an example of which is shown in FIG. 8. In the illustrated example, the package 300 includes a plurality of die interconnects 316 (one of which is shown in FIG. 3) that electrically couple certain ones of the die pads 310 and the balls 314. Therefore, signals can be transferred through the package substrate 302 between the die 308 and the underlying circuit board. The package substrate 302 can include any number of pads 310, balls 314, and/or interconnects 316, and the interconnects 316 can couple pairs or multiple ones of the die pads 310 and the balls 314.

In the illustrated example, the package 300 includes an integrated heat spreader (IHS) 318 mounted on the first side 304 of the package substrate 302. The IHS 318 at least partially encloses or covers the die 308. The IHS 318 helps dissipate heat from the die 308. In other examples, the package 300 may not include an IHS.

In the illustrated example, the package 300 includes a plurality of example memory pads 320 (one of which is referenced in FIG. 3) on the first side 304 of the package substrate 302. The package 300 can include any number of memory pads. In this example, the memory pads 320 extend outward from the first side 304. However, in other examples, the memory pads 320 can be flush or recessed relative to the first side 304. The memory pads 320 are to be electrically coupled to a memory mounted on the first side 304 of the package substrate 302. In the illustrated example, the package 300 includes a plurality of memory interconnects 322 (one of which is referenced in FIG. 3) in and/or on the package substrate 302. The memory interconnects 322 can be constructed of one or more vias and/or traces in and/or on the package substrate 302. Vias extend through and/or into the package substrate 302 in a direction that is perpendicular to the first and second sides 304, 306 (e.g., vertically in FIG. 3). Traces extend through or across the package substrate 302 in a direction that is parallel to the first and second sides 304, 306 (e.g., horizontally or laterally in FIG. 3). The memory interconnects 322 (e.g., the one or more vias and/or traces) are constructed of electrically conductive material, such as copper. The memory interconnects 322 electrically couple certain ones of the memory pads 320 and certain ones of the die pads 310. As such, when a memory is attached to the memory pads 320, the memory and the die 308 are electrically coupled.

For example, FIG. 4 shows an example in which the example package 300 includes a memory 400 mounted on the package substrate 302. In the illustrated example, the memory 400 is mounted on the first side 304 of the package substrate 302. The memory 400 is electrically and mechanically coupled to the package substrate 302. The package 300 can include any number of memories. The memory 400 has a plurality of balls 402 (one of which is referenced in FIG. 4) engaged with the memory pads 320 (one of which is referenced in FIG. 4), which electrically couples the memory 400 and the package substrate 302. In some examples, the balls 402 and the memory pads 320 are fused or soldered (e.g., by processing in a reflow oven), which electrically and mechanically couples the memory 400 and the package substrate 302. In some examples, the memory 400 is a digital random-access memory (DRAM). In other examples, the memory 400 can be another type of memory. In some examples, the memory 400 uses Double Data Rate (DDR) signaling. As such, the memory pads 320 and/or the balls 324 may be referred to as DDR pins, and the memory interconnects 322 may be considered DDR interconnects or traces.

To enable easier testing, the memory interconnects 322 also electrically couple certain ones of the memory pads 320 on the first side 304 to contacts on the second side 306 of the package substrate 302. For example, as shown in FIGS. 3 and 4, the package 300 includes a second plurality of balls 324 on the second side 306 of the package substrate 302. The memory interconnects 322 include vias that extend entirely through the package substrate 302 between the first side 304 and the second side 306 to electrically couple corresponding ones of the memory pads 320 and the balls 324. As disclosed in further detail herein, this enables a memory to be temporarily socketed to the memory interconnects 322 from the second side 306 (the bottom side) of the package substrate 302, so that a separate memory socket does not need to be attached to the first side 304 of the package substrate 302. As such, the memory can be located closer to the die 308 and/or the IHS 318. For example, as shown in FIG. 4, the memory 400 is spaced from the IHS 318 by a distance of D2, which is less than the distance D1 shown in FIG. 1. In some examples, the distance D2 is one millimeter (mm) or less. As such, the example package 300 enables the components on the package 300 to be arranged closer to each other, which reduces the overall size and footprint of the package 300.

The package 300 can include any number of memory pads 320, memory interconnects 322, and/or balls 324. While the illustrated example has memory pads 320 for contacts on the first side 304 and balls 324 for contacts on the second side 306, the package 300 can utilize any type of contacts, such as pins, bumps, balls, pads, etc.

FIG. 5 is an enlarged view of a portion of the package 300 showing a first memory interconnect 322a and a second memory interconnect 322b of the plurality of memory interconnects 322. The first memory interconnect 322a electrically couples a first memory pad 320a of the plurality of memory pads 320, a first die pad 310a of the plurality of die pads 310, and a first ball 324a of the second plurality of balls 324a. As shown in FIG. 5, the first memory interconnect 322a has a first via 500 that extends through the package substrate 302 between the first and second sides 304, 306. The first via 500 electrically couples the first memory pad 320a on the first side 304 and the first ball 324a on the second side 306. In the illustrated example, the first via 500 is formed by a plurality of stubs 501 (one of which is referenced in FIG. 5). In some examples, the stubs 501 are fabricated or constructed during the process of manufacturing the package substrate 302. For example, after each layer of substrate material is added, a recess or opening may be formed in the layer, and a stub of electrically conductive material may be added to the opening. The stubs 501 are vertically aligned to create a vertical conductive pathway. In the illustrated example, the first memory interconnect 322a also includes a first trace 502 and a second via 504 that electrically couple the first die pad 310a and the first via 500. The first trace 502 extends laterally (horizontally) through the package substrate 302, and the second via 504 extends vertically in the package substrate 302. The first trace 502 and the second via 504 can also be constructed during the process of manufacturing the package substrate 302. Therefore, the first memory interconnect 322a electrically couples the first memory pad 320a and the first die pad 310a on the first side 304 and the first ball 324a on the second side 306. The first trace 502 may be formed at any depth in the package substrate 302. In some examples, the first trace 502 can be formed on the first side 304. The first via 500, the first trace 502, and the second via 504 can be constructed of electrically conductive material, such as copper or tin.

Similarly, in the illustrated example of FIG. 5, the second memory interconnect 322b electrically couples a second memory pad 320b of the plurality of memory pads 320, a second die pad 310b of the plurality of die pads 310, and a second ball 324b of the second plurality of balls 324. As shown in FIG. 5, the second memory interconnect 322b has a third via 506 that extends through the package substrate 302 between the first and second sides 304, 306. The third via 506 electrically couples the second memory pad 320b on the first side 304 and the second ball 324b on the second side 306. In the illustrated example, the second memory interconnect 322b also has a second trace 508 that extends laterally through the package substrate 302 to a fourth via 510 that is electrically coupled to the second die pad 310b. The second trace 508 extends laterally (into or out of the page) around the first via 500. Therefore, the second memory interconnect 322b electrically couples the second memory pad 320b and the second die pad 310b on the first side 304 and the second ball 314a on the second side 306. In this example, the second trace 508 is spaced vertically below the first trace 502 in the package substrate 302. In other examples, the traces can be offset in a lateral or horizontal direction.

The package 300 can include any number of memory interconnects in and/or on the package substrate 302, and the memory interconnects are similarly structured as disclosed in connection with the first and second memory interconnects 322a, 322b. Each of the memory interconnects electrically couples one of the memory pads 320 and one of the die pads 310, and also includes a via that extends through the package substrate 302 to electrically couple one of the memory pads 320 on the first side 304 and one of the balls 324 on the second side 306. The vias can be fabricated stacks of stubs added in layers of the substrate. Therefore, the memory interconnects 322 electrically couple corresponding ones of the die pads 310, the memory pads 320, and the balls 324.

In some examples, the vias (e.g., the first and third vias 500, 506) of the memory interconnects 322 are perpendicular or transverse to the package substrate 302. As such, the pinout or ballmap pattern is the same on the first and second sides 304, 306 of the package substrate 302. In particular, a first pattern of the balls 324 on the second side 306 (the bottom side) of the package substrate 302 is the same as a second pattern of the memory pads 320 on the first side 304 (the top side) of the package substrate 302. For example, FIGS. 6A and 6B show top views of a top layer and a bottom layer of the package substrate 302, respectively. As shown, a first pattern 600 of the ballmap on the bottom layer (FIG. 6B) (corresponding to the balls 324) is the same as a second pattern 602 of the ballmap on the top layer (FIG. 6A) (corresponding to the memory pads 320). This enables a memory having the same pattern to be easily socketed to the balls 324 on the second side 306 of the package substrate 302 during testing.

In some examples, a package manufacturer may test the package 300 according to a PPV testing procedure prior to selling the package. The manufacturer may then sell the package 300 to a customer who can install their own memory and/or attach the package 300 to a circuit board.

FIG. 7 shows an example TIU 700 that can be used to test the package 300 during a PPV testing procedure. The TIU 700 includes an example test board 702 for testing the package 300. In the illustrated example, the TIU 700 includes a socket 704 with pogo pins 706 (one of which is referenced in FIG. 7) that electrically couples the balls 314 (one of which is referenced in FIG. 7) to the test board 702. As such, the test board 702 can be used to test the various connections, logic, etc. on the package 300.

In the illustrated example, the TIU 700 includes a memory 708 (e.g., a test memory) that can be used when testing the package 300. In some examples, the memory 708 is a DRAM. The memory 708 is connected to a bottom side of the socket 704. The socket 704 electrically couples (e.g., via the pogo pins 706) the memory 708 to the balls 324 on the second side 306 of the package substrate 302 and, thus, to the memory interconnects 322. This mimics an OPM configuration without having to have a memory mounted on the first side 304 (the top side) of the package 300.

In some examples, the memory 708 has a mirrored type of ballmap. Thus, the memory 708 can be connected to the memory pads 320 on the first side 304 or flipped over and connected to the balls 324 on the second side 306 without affecting the operability. In some examples, the ballmap, when reversed, can be handle by a mux through the central processing unit (CPU) DDR. For example, all data bus lines (e.g., DQs) can be swapped within their own group, and/or CACs can be muxed with an ascending and descending configuration. In some examples, the package 300 can have a small route on the package substrate 302 to meet the top and bottom side ball of signal (specially CACs) meeting with ascending/descending muxing and some power & GND ball matching.

In the illustrated example, the test board 702 has an opening 710 (e.g., a through-hole, a recess, etc.) to accommodate the memory 708. In some examples, the TIU 700 includes a retainer 712 to secure the memory 708 in the test board 702 while attached to the package 300.

Because the memory interconnects 322 are electrically coupled to certain ones of the balls 324 on the second side 306 of the package substrate 302, all of the contacts can be socketed and tested from the second side 306 (the bottom side) of the package substrate 302. Therefore, the TIU 700 does not require an additional socket on the first side 304 (the top side) of the package substrate 302, as seen in known testing configurations. As such, because a top socket is not required for the first side 304, the package 300 can be configured such that the memory pads 320 for a memory are positioned closer to the die 308 and/or the IHS 318. This significantly reduces the overall footprint of the components on the package substrate 302, thereby enabling a smaller more compact package. This also enables a package manufacturer to test and sell the package without having to have (e.g., own, develop, fabricate) the memories.

In some examples, the vias (e.g., the first and third vias 500, 506) of the memory interconnects 322 are perpendicular or transverse to the package substrate 302. This creates the shortest path between the first and second sides 304, 306, which minimizes any possible negative effects of the increased signal length for high speed testing (e.g., DDR testing).

FIG. 8 shows an example assembly 800 that includes an example circuit board 802 (sometimes referred to as a motherboard) and the example package 300 mounted on the circuit board 802. Multiple ones of the package 300 and/or other packages can be mounted on the circuit board 802. The package 300 is electrically and mechanically coupled to the circuit board 802. In the illustrated example, the package 300 includes the memory 400, which is electrically coupled to the memory pads 320 (one of which is referenced in FIG. 8). One or more of the balls 314 (one of which is referenced in FIG. 8) are engaged with corresponding pads 804 (one of which is referenced in FIG. 8) on the circuit board 802, which electrically couples the package 300 and the circuit board 802. In some examples, one or more of the balls 314 and the pads 804 are fused or soldered (e.g., by processing in a reflow oven), which electrically and mechanically couples the package 300 and the circuit board 802.

In some examples, the balls 324 (one of which is referenced in FIG. 8) on the second side 306 of the package substrate 302 do not engage any contacts on the circuit board 802, or the balls 324 may engage dummy contacts on the circuit board 802 that are not electrically coupled to any other component. Instead, the balls 324 that are coupled to the memory interconnects 322 are only used during testing. Therefore, in some examples, these balls 324 are not used when the package 300 is coupled to the circuit board 802. However, in other examples, the circuit board 802 can have one or more contacts (e.g., balls, pins, and/or pads) and/or traces that electrically couple the balls 324 to one or more other components (e.g., another package, a memory, etc.).

Figure 9:
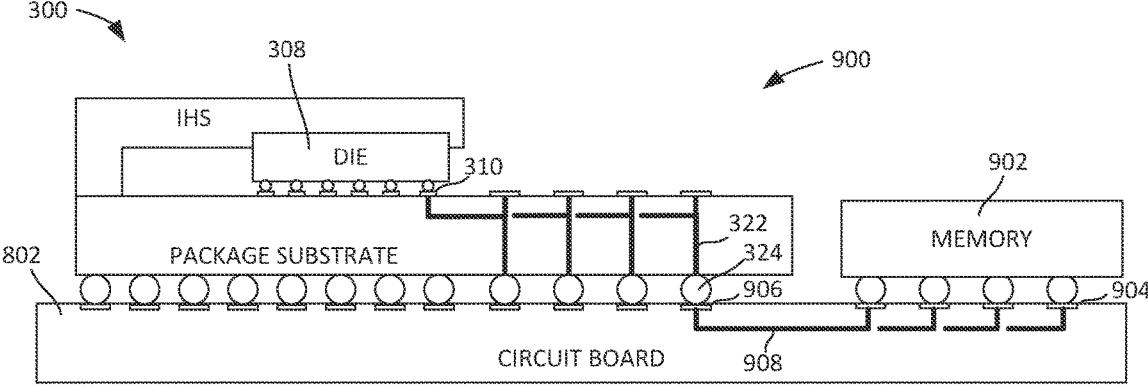
FIG. 9 illustrates an example assembly configuration including an example circuit board, the example IC package of FIG. 3 on the example circuit board, and an example memory on the example circuit board.

The example package 300 can also be advantageously used with a memory down configuration in which a memory is coupled to the circuit board 802 instead of being on the package 300. For example, FIG. 9 shows an example configuration 900 in which a memory 902 (e.g., a DRAM) is mounted on the circuit board 802 instead of the package 300. In this example, the circuit board 802 includes a first set of pads 904 (one of which is referenced in FIG. 9). The memory 902 is mounted on the circuit board 802 such that the memory 902 is electrically coupled to the first set of pads 904. The circuit board 802 also includes a second set of pads 906 (one of which is reference in FIG. 9) that are contacted by the balls 324 on the package 300 that are electrically coupled to the memory interconnects 322 (one of which is referenced in FIG. 9). The balls 324 are electrically coupled (e.g., soldered, fused), to the second set of pads 906. The circuit board 802 includes interconnects 908 (one of which is referenced and shown in FIG. 9) in the circuit board 802 that electrically couple the first set of pads 904 and the second set of pads 906. As such, the memory 904 is electrically coupled to the die 308 via the first set of pads 904, the interconnects 908, the second set of pads 906, the balls 324, the memory interconnects 322, and the die pads 310. This enables a user to easily customize the assembly with a memory on the package 300 or off the package 300.

Figure 10:
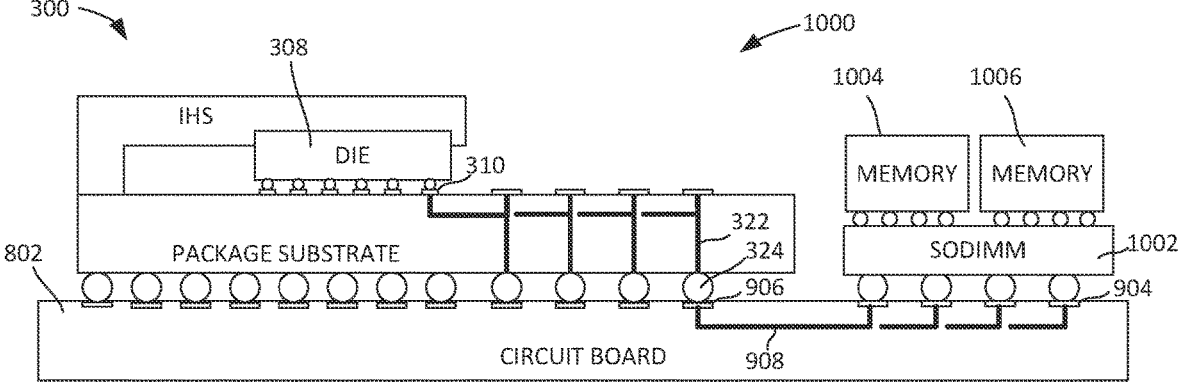
FIG. 10 illustrates an example assembly configuration including an example circuit board, the example IC package of FIG. 3 on the example circuit board, and an example Small Outline Dual In-line Memory Module (SODIMM) on the example circuit board.

FIG. 10 shows another example configuration in which a Small Outline Dual In-line Memory Module (SODIMM) 1002 is mounted on the circuit board 802 and electrically coupled to the first set of pads 904. The SODIMM 1002 is a memory module that can include one or multiple memories, such as the memories 1004, 1006 (e.g., DRAMs). The SODIMM 1002 (and, thus, the memories 1004, 1006) is/are electrically coupled to the die 308 via the first set of pads 904, the interconnects 908, the second set of pads 906, the balls 324, the memory interconnects 322, and the die pads 310.

FIG. 11 is a flowchart illustrating an example method 1100 of manufacturing the example package 300 of FIGS. 3-10. The example method 1100 is described in connection with the first memory interconnect 322a illustrated in FIG. 5. However, the method 1100 can be similarly implemented in connection with the other memory interconnects 322. Although the example method of manufacture is described with reference to the flowchart illustrated in FIG. 11, many other methods may alternatively be used. For example, the order of execution of the blocks may be changed, and/or some of the blocks described may be combined, divided, re-arranged, omitted, eliminated, and/or implemented in any other way.

The example method 1100 begins a block 1102 with fabricating the package substrate 302. In some examples, the package substrate 302 is fabricated by successively building (e.g., adding) a plurality of layers of substrate material (e.g., epoxy resin).

Block 1104 includes adding (e.g., via plating or other suitable deposition process) the first memory pad 320a on the first side 304 of the package substrate 302. The first memory pad 320a is used for mounting a memory to the package substrate 302. For example, a memory (e.g., the memory 400) can be electrically coupled (e.g., fused or soldered) to the first memory pad 320 on the first side 304 of the package substrate 302.

Block 1106 includes adding (e.g., via plating or other suitable deposition process) the first ball 324a on the second side 306 of the package substrate 302 opposite the first side 304.

Block 1108 includes adding (e.g., via plating or other suitable deposition process) the first via 500 of the first memory interconnect 322a through the package substrate 302 between the first side 304 and the second side 306. After the first memory pad 320a and the first ball 324a are added, the first via 500 electrically couples the first memory pad 320a on the first side 304 and the first ball 324a on the second side 306. In some examples, the first via 500 is formed during the fabricating process (at block 1102) (e.g., prior to adding the first memory pad 320a and/or the first ball 324a). In particular, the example process may include adding stubs (e.g., via plating or other suitable deposition process) in each of the layers of the package substrate material in a vertical alignment. The resulting stack of stubs forms the first via 500.

Block 1110 includes adding (e.g., via plating or other suitable deposition process) the first die pad 310a on the first side 304 of the package substrate 302.

Block 1112 includes adding (e.g., via plating or other suitable deposition process) the trace 502 and the second via 504 of the first memory interconnect 322a in and/or on the package substrate 302. The trace 502 and the second via 504 electrically couple the first via 500 and the first die pad 310a. In some examples, the trace 502 and/or the second via 504 are formed during the fabricating process (at block 1102). In particular, the example process may include adding traces and/or stubs (e.g., via plating or other suitable deposition process) in one or more of the layers as the layers are added. Therefore, in some examples, the first memory interconnect 322a is added during block 1102 while fabricating the package substrate 302. In other words, the first memory interconnect 322a can be added to the package substrate 302. Then, the first memory pad 320a is added on the first side 304 (such that the first memory pad 320a is in connection with the first via 500) at block 1104, and the first ball 324a is added on the second side 306 (such that the first ball 324a is in connection with the first via 500) at block 1106. In other examples, the first memory interconnect 322a can be added after the first memory pad 320a and/or the first ball 324a is added.

In some examples, a die is mounted on the package substrate 302. For example, at block 1114, the die 308 is mounted to the first side 304 of the package substrate 302 such that the die is electrically coupled to the first die pad 310a. In some examples, the die 308 is fused or soldered to the first die pad 310a.

In some examples, the method 1100 also includes adding (e.g., via plating or other suitable deposition process) the one or more die pads 310 on the first side 304 of the package substrate 302, adding (e.g., via plating or other suitable deposition process) the one or more balls 314 on the second side 306 of the package substrate, and adding (e.g., via plating or other suitable deposition process) the interconnects 316 in and/or on the package substrate 302 between the die pads 310 and the balls 314. In some examples, the method 1100 includes mounting the IHS 318 on the first side 304 of the package substrate 302 to at least partially cover or enclose the die 308.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that enable a memory to be mounted on a package in a closer or tighter configuration with a die, and while still being able to test the package without having to mount the memory on the package. The examples disclosed herein enable a memory to be temporarily socketed to a bottom side of a package during testing, such that a separate socket does not need to be used on a top side of the package during testing.

Example systems, methods, apparatus, and articles of manufacture have been disclosed. Examples and example combinations include the following:

Example 1 is an integrated circuit (IC) package including a substrate having a first side and a second side opposite the first side, a semiconductor die mounted on the first side of the substrate, and a die pad on the first side of the substrate. The die is electrically coupled to the die pad. The IC package includes a memory pad on the first side of the substrate. The memory pad is to be electrically coupled to a memory mounted on the first side of the substrate. The IC package also includes a ball on the second side of the substrate and a memory interconnect in the substrate electrically coupling the die pad, the memory pad, and the ball.

Example 2 includes the IC package of Example 1, wherein the memory interconnect includes a first via extending through the substrate between the first side and the second side. The first via electrically couples the memory pad on the first side of the substrate and the ball on the second side of the substrate.

Example 3 includes the IC package of Example 2, wherein the memory interconnect includes a trace and a second via that electrically couple the die pad and the first via.

Example 4 includes the IC package of any of Examples 1-3, further including: a plurality of die pads on the first side of the substrate; a plurality of memory pads on the first side of the substrate; a plurality of balls on the second side of the substrate; and a plurality of memory interconnects in the substrate electrically coupling corresponding ones of the die pads, the memory pads, and the balls.

Example 5 includes the IC package of any of Examples 1-4, further including an integrated heat spreader (IHS) mounted on the first side of the substrate and at least partially covering the die.

Example 6 is an assembly including a circuit board and the package of claim 1 mounted on the circuit board.

Example 7 includes the assembly of Example 6, further including a memory mounted on the first side of the package. The memory is electrically coupled to the memory pad.

Example 8 includes the IC package of Example 7, wherein the memory is a digital random-access memory (DRAM).

Example 9 includes the assembly of Examples 7 or 8, wherein the ball on the second side of the substrate does not engage a contact on the circuit board.

Example 10 includes the assembly of any of Examples 6-9, further including: a first pad on the circuit board, the ball electrically coupled to the first pad; a second pad on the circuit board; a memory mounted on the circuit board such that the memory is electrically coupled to the second pad; and an interconnect in the circuit board to electrically couple the first pad and the second pad.

Example 11 includes the assembly of any of Examples 6-9, further including: a first pad on the circuit board, the ball electrically coupled to the first pad; a second pad on the circuit board; a Small Outline Dual In-line Memory Module (SODIMM) mounted on the circuit board such that the SODIMM is electrically coupled to the second pad; and an interconnect to in the circuit board to electrically couple the first pad and the second pad.

Example 12 is a method including fabricating a package substrate, adding a memory pad on a first side of the package substrate, adding a ball on a second side of the package substrate opposite the first side, and adding a via through the package substrate between the first and second sides, the via to electrically couple the memory pad and the ball.

Example 13 includes the method of Example 12, wherein adding the via includes adding stubs in layers of package substrate material.

Example 14 includes the method of Examples 12 or 13, wherein the via is a first via, the method further including: adding a die pad on the first side of the package substrate; and adding a trace and a second via in the package substrate to electrically couple the first via and the die pad.

Example 15 includes the method of Example 14, further including mounting a die on the first side of the package substrate such that the die is electrically coupled to the die pad.

Example 16 is an integrated circuit (IC) package including a substrate having a first side and a second side opposite the first side and memory pads on the first side of the substrate. The memory pads are to be electrically coupled to a memory mounted on the first side of the substrate. The IC package includes balls on the second side of the substrate and vias in the substrate electrically coupling corresponding ones of the memory pads and the balls, such that a first pattern of the balls on the second side of the substrate is the same as a second pattern of the memory pads on the first side of the substrate.

Example 17 includes the IC package of Example 16, wherein the vias are fabricated from stacks of stubs added in layers of the substrate.

Example 18 includes the IC package of Examples 16 and 17, further including die pads on the first side of the substrate. The die pads are to be electrically coupled to a semiconductor die mounted on the first side of the substrate.

Example 19 includes the IC package of Example 18, wherein the vias form part of memory interconnects that electrically couple corresponding ones of the memory pads, the balls, and the die pads.

Example 20 includes the IC package of any of Examples 16-19, further including a memory mounted on the first side of the substrate and electrically coupled to the memory pads.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An integrated circuit (IC) package comprising:
a substrate having a first surface and a second surface opposite the first-side surface;
a semiconductor die on the first surface of the substrate;
a die pad on the first surface of the substrate, the semiconductor die electrically coupled to the die pad;
a memory pad on the first surface of the substrate, the memory pad to be electrically coupled to a memory to be mounted on the first side surface of the substrate, the memory pad and the die pad in a same plane parallel to the first surface;
a ball on the second surface of the substrate; and
a single memory interconnect in the substrate electrically coupling the die pad, the memory pad, and the ball, the memory interconnect including a straight line of conductive material extending completely through the substate from the memory pad on the first surface of the substrate and to the ball on the second surface of the substrate.

2. The IC package of claim 1, including a trace and a via that electrically couple the die pad and the line of conductive material.

3. The IC package of claim 1, wherein the die pad is one of a plurality of die pads on the first surface of the substrate, and the memory pad is one of a plurality of memory pads on the first surface of the substrate, and the ball is one of a plurality of balls on the second surface of the substrate and the single memory interconnect is one of a plurality of memory interconnects in the substrate, respective ones of the plurality of memory interconnects electrically coupling a corresponding one of the die pads, a corresponding one of the memory pads, and a corresponding one of the balls.

4. The IC package of claim 1, including an integrated heat spreader (IHS) on the first surface of the substrate and at least partially covering the semiconductor die.

5. An assembly comprising:
a circuit board; and
the IC package of claim 1 mounted on the circuit board.

6. The assembly of claim 5, including a memory mounted on the first side surface of the substrate, the memory electrically coupled to the memory pad.

7. The assembly of claim 5, including:
a first pad on the circuit board, the ball electrically coupled to the first pad;
a second pad on the circuit board;
a memory on the circuit board such that the memory is electrically coupled to the second pad; and
an interconnect in the circuit board to electrically couple the first pad and the second pad.

8. The assembly of claim 5, including:
a first pad on the circuit board, the ball electrically coupled to the first pad;
a second pad on the circuit board;
a Small Outline Dual In-line Memory Module (SODIMM) on the circuit board such that the SODIMM is electrically coupled to the second pad; and
an interconnect to in the circuit board to electrically couple the first pad and the second pad.

9. The IC package of claim 6, wherein the memory is a digital random-access memory (DRAM).

10. The assembly of claim 6, wherein the ball on the second side surface of the substrate does not engage a contact on the circuit board.

11. A method comprising:
fabricating a package substrate;
adding a memory pad on a first side of the package substrate, the memory pad exposed on the first side of the package substrate;
adding a die pad on the first side of the package substrate, the die pad exposed on the first side of the package substrate;
adding a ball on a second side of the package substrate opposite the first side;
adding a stack of stubs through the package substrate between the first and second sides to electrically couple the memory pad and the ball, the stack of stubs in a single line and extending completely through the package substrate between the memory pad and the ball; and
adding a trace in the package substrate that branches off of the stack of stubs and is electrically coupled to the die pad to electrically couple the die pad, the memory pad, and the ball, the stack of stubs providing the only path through the package substrate that electrically couples the die pad to the second side of the package substrate.

12. The method of claim 11, including mounting a die on the first side of the package substrate such that the die is electrically coupled to the die pad.

13. An integrated circuit (IC) package comprising:

a substrate having a first side and a second side opposite the first side;

memory pads on the first side of the substrate, the memory pads to be electrically coupled to a memory mounted on an exterior surface of the first side of the substrate, the memory pads in a first pattern and spacing to be mechanically coupled directly to balls on the memory;

die pads on the first side of the substrate, the die pads to be electrically coupled to a semiconductor die mounted on the exterior surface of the first side of the substrate;

balls on the second side of the substrate; and vias in the substrate electrically coupling corresponding ones of the memory pads and the balls, the vias extending in substantially parallel lines through the substrate such that a second pattern and spacing of the balls on the second side of the substrate is the same as the first pattern and spacing of the memory pads on the first side of the substrate, a first one of the die pads electrically coupled to a first one of the vias that electrically couples a corresponding first one of the memory pads to a corresponding first one of the balls, the first one of the die pads electrically coupled to the second side of the substrate exclusively through the first one of the vias.

14. The IC package of claim 13, wherein the vias are stacks of stubs in layers of the substrate.

15. The IC package of claim 13, wherein the vias form part of memory interconnects, respective ones of the memory interconnects electrically couple corresponding ones of the memory pads, corresponding ones of the balls, and corresponding ones of the die pads.

16. The IC package of claim 13, including the memory mounted on the first side of the substrate and electrically coupled to the memory pads.

17. The IC package of claim 13, wherein respective ones of the vias include a single stack of stubs connecting one of the memory pads on the first side and one of the balls on the second side.

18. The IC package of claim 13, wherein the balls are first balls, and the IC package includes second balls distributed along the second side of the substrate, the second balls to electrically couple the semiconductor die to a circuit board, the first balls to be electrically isolated from contacts on the circuit board when the second balls are electrically coupled to the circuit board.

19. The IC package of claim 18, wherein the first balls are distributed across a first area of the second surface, and the second balls are distributed across a second area of the second surface, the second area spaced apart from the first area, the first area equivalent to a third area across which the memory pads are distributed, the second area larger than a fourth area across which the die pads are distributed.

20. The IC package of claim 1, wherein the ball is a first ball, and the memory is to be mounted on the first surface of the substrate spaced apart from and beside the semiconductor die, the IC package including:

a second ball on the second surface of the substrate; and a die interconnect in the substrate electrically coupling the semiconductor die to the second ball.

* * * * *